United States Patent
Hakamata et al.

(10) Patent No.: US 10,361,366 B2
(45) Date of Patent: Jul. 23, 2019

(54) RESISTIVE RANDOM ACCRESS MEMORY CONTAINING A CONFORMAL TITANIUM ALUMINUM CARBIDE FILM AND METHOD OF MAKING

(71) Applicant: Tokyo Electron Limited, Minato-ku, Tokyo (JP)

(72) Inventors: Takahiro Hakamata, Albany, NY (US); Genji Nakamura, Nirasaki (JP); Sara Aoki, Nirasaki (JP); Toshio Hasegawa, Delmar, NY (US); Takamichi Kikuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/054,699

(22) Filed: Aug. 3, 2018

(65) Prior Publication Data
US 2019/0044064 A1    Feb. 7, 2019

Related U.S. Application Data

(60) Provisional application No. 62/540,926, filed on Aug. 3, 2017.

(51) Int. Cl.
*H01L 45/00* (2006.01)
*G11C 13/00* (2006.01)
*H01L 41/08* (2006.01)

(52) U.S. Cl.
CPC ...... *H01L 45/1233* (2013.01); *G11C 13/0007* (2013.01); *H01L 41/08* (2013.01); *H01L 45/1253* (2013.01); *H01L 45/146* (2013.01); *H01L 45/16* (2013.01); *H01L 45/1616* (2013.01); *H01L 45/1658* (2013.01)

(58) Field of Classification Search
CPC ............... H01L 45/1233; H01L 45/146; H01L 45/1616; H01L 45/1658
See application file for complete search history.

(56) References Cited

U.S. PATENT DOCUMENTS

| | | | |
|---|---|---|---|
| 8,362,454 B2 | 1/2013 | Lee et al. | |
| 9,985,206 B1 * | 5/2018 | Ando | H01L 45/146 |
| 10,002,936 B2 * | 6/2018 | Haukka | H01L 29/4966 |
| 10,049,913 B2 * | 8/2018 | Tapily | H01L 21/02164 |
| 2004/0208994 A1 | 10/2004 | Harkonen et al. | |
| 2015/0255511 A1 | 9/2015 | Takagi et al. | |
| 2016/0336414 A1 | 11/2016 | Kang | |

* cited by examiner

*Primary Examiner* — Allison Bernstein

(57) ABSTRACT

A plurality of embodiments for ReRAM devices and method of making are described. According to one embodiment, the ReRAM device includes a first electrode film formed on a substrate, a metal oxide film with oxygen vacancies formed on a first electrode film, a conformal TiAlC film, oxidized by diffused oxygen atoms from the metal oxide film, formed on the metal oxide film, and a second electrode film formed on the TiAlC film. According to another embodiment, the ReRAM device includes a pair of vertical metal oxide films, a pair of vertical conformal TiAlC films formed on the pair of vertical metal oxide films, the pair of vertical conformal TiAlC films oxidized by diffused oxygen atoms from the pair of vertical metal oxide films, and an electrode film formed between the pair of vertical conformal TiAlC films.

20 Claims, 2 Drawing Sheets

RESISTIVE RANDOM ACCESS MEMORY CONTAINING A CONFORMAL TITANIUM ALUMINUM CARBIDE FILM AND METHOD OF MAKING

CROSS-REFERENCE TO RELATED APPLICATIONS

This application is related to and claims priority to U.S. Provisional Patent Application Ser. No. 62/540,926 filed on Aug. 3, 2017, the entire contents of which are herein incorporated by reference.

FIELD OF THE INVENTION

The present invention relates to semiconductor processing and semiconductor devices, and more particularly, to resistive random access memory (ReRAM) devices and method of making.

BACKGROUND OF THE INVENTION

ReRAM devices are a class of storage memory devices. The basic idea behind ReRAM devices is that a dielectric film which is normally insulating, can be made to conduct current through a filament or conduction path formed after application of a sufficiently high voltage. The conduction path can arise from different mechanisms, including vacancy or metal defect migration. Conventional plasma-assisted film deposition does not provide adequate film conformality for high aspect ratio vertical three dimensional (3D) ReRAM devices due to the directional film deposition characteristics. Therefore, there is a need for new methods for depositing conformal films with excellent step coverage, material properties, and electronic properties for vertical 3D ReRAM devices.

SUMMARY OF THE INVENTION

Embodiments of the invention describe thermal atomic layer deposition (ALD) of conformal titanium aluminum carbide (TiAlC) films that exhibit excellent step coverage, material properties, and electronic properties for vertical 3D ReRAM devices. The thermal ALD is carried out in the absence of a plasma using alternating gaseous exposures of reactant gases.

According to one embodiment, a resistive random access memory is provided that includes a first electrode film formed on a substrate, a metal oxide film with oxygen vacancies formed on the first electrode film, a conformal TiAlC film, oxidized by diffused oxygen atoms from the metal oxide film, formed on the metal oxide film, and a second electrode film formed on the TiAlC film. The first and second electrode films may also be referred to as bottom and top electrode films, respectively.

According to another embodiment, a vertical 3D resistive random access memory is provided that includes a pair of vertical metal oxide films, a pair of vertical conformal TiAlC films formed on the pair of vertical metal oxide films, the pair of vertical conformal TiAlC films oxidized by diffused oxygen atoms from the pair of vertical metal oxide films, and an electrode film formed between the pair of vertical conformal TiAlC films.

According to another embodiment, a method of forming a resistive random access memory is provided where the method includes forming a first electrode on a substrate, forming a metal oxide film with oxygen vacancies on the first electrode, forming a conformal TiAlC film on the metal oxide film, the conformal TiAlC film oxidized by diffused oxygen atoms from the metal oxide film, and forming a second electrode on the conformal TiAlC film.

According to another embodiment, a method of forming vertical 3D resistive random access memory is provided that includes forming a pair of vertical metal oxide films, forming a pair of vertical conformal TiAlC films on the pair of vertical metal oxide films, the pair of vertical conformal TiAlC films oxidized by diffused oxygen atoms from the pair of vertical metal oxide films, and forming an electrode film between the pair of vertical conformal TiAlC films.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Some embodiments of the invention describe a method for depositing a TiAlC film in the manufacturing of a ReRAM element. According to one embodiment, the ReRAM element can include a first electrode film, a metal oxide film, a TiAlC film adjacent to the metal oxide film, and a second electrode film. The TiAlC film has the characteristics of an oxygen scavenging (gettering) film that facilitates diffusion of oxygen atoms from the metal oxide film into the oxygen scavenging film, thereby forming oxygen vacancies in the metal oxide film. The oxygen vacancies can further capture or release electric charges which provides stable resistance switching characteristics required for ReRAM elements. The thermal ALD of the conformal TiAlC film provides the excellent step coverage, material properties, and electronic properties for vertical 3D ReRAM devices.

Figure 1:
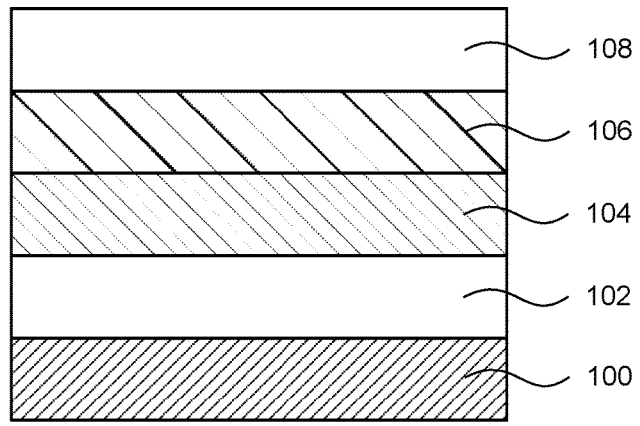
FIG. 1 schematically shows an exemplary ReRAM element according to an embodiment of the invention.

FIG. 1 schematically shows an exemplary ReRAM element according to an embodiment of the invention. The substrate 100 can include a semiconductor substrate, such as a silicon substrate. A first electrode film 102 is formed on the substrate 100. Although not shown in FIG. 1, the first electrode film 102 may be electrically connected to a drain electrode of a transistor device. In some examples, the material of the first electrode film 102 may be selected from the group consisting of TaN, TiN, TiAlN, TiW, Pt, W, Ru, and a combination thereof.

A metal oxide film 104 is formed on the first electrode film 102 and a TiAlC film 106 is formed on the metal oxide film 104. According to the exemplary embodiment shown in FIG. 1, the metal oxide film 104 is formed directly on the first electrode film 102 and the TiAlC film 106 is formed directly on the metal oxide film 104. The metal oxide film

104 may, for example, be selected from the group consisting of $Al_2O_3$, $HfO_2$, $TiO_2$, $ZrO_2$, and a combination thereof. In one example, the combination can include a laminate of two or more of $Al_2O_3$, $HfO_2$, $TiO_2$, and $ZrO_2$. One example the laminate includes a $HfO_2$ film on an $Al_2O_3$ film. In one example, the metal oxide film 104 may be deposited by ALD to provide good conformality and step coverage.

The TiAlC film 106 may be selected from TiAlC films with different chemical compositions. In one example, the atomic percentage of Ti, Al, and C in the TiAlC film 106 may decrease as C>Ti>Al. In order to achieve oxygen diffusion from the metal oxide film 104 into the TiAlC film 106, the TiAlC film 106 must have a lower oxidation chemical formation energy than the metal oxide film 104. As a result, oxygen atoms in the metal oxide film 104 will diffuse into and react with the TiAlC film 106. The diffusion of oxygen atoms may be enhanced or initiated by an annealing process following deposition of the TiAlC film 106.

According to an embodiment of the invention, the TiAlC film 106 may be deposited by ALD. In general, ALD refers to a process of depositing a thin film on a substrate that involves sequential and alternating self-saturating surface reactions. These self-saturating surface reactions result in conformal films with excellent step coverage. According to some embodiments, the TiAlC film by be deposited by thermal ALD using alternation gaseous exposures of a titanium halide and an aluminum alkyl. The aluminum alkyl can provide aluminum and carbon for the TiAlC film and may be selected from the group consisting of $AlMe_3$, $AlEt_3$, $AlPr_3$, and $Al(i-Bu)_3$. The titanium halide may be selected from the group consisting of $TiF_4$, $TiCl_4$, $TiBr_4$, and $TiI_4$. According to one embodiment, a TiAlC film may be deposited by thermal ALD (thermal-ALD TiAlC) using alternating gaseous exposures of titanium tetrachloride ($TiCl_4$) and trimethylaluminum ($AlMe_3$).

Exemplary substrate temperatures for ALD deposition of the TiAlC film 106 range from about 350° C. to about 450° C. However, other substrate temperatures may be used. Exemplary TiAlC chemical compositions include 20-70 atomic percent Ti, 2-70 atomic percent Al, and 10-70 atomic percent C.

Still referring to FIG. 1, a second electrode film 108 is formed on the TiAlC film 106. In some examples, the material of the second electrode film 108 may be selected from the group consisting of TaN, TiN, TiAlN, TiW, Pt, W, Ru, and a combination thereof.

Figures 2A, 2B, 2C:
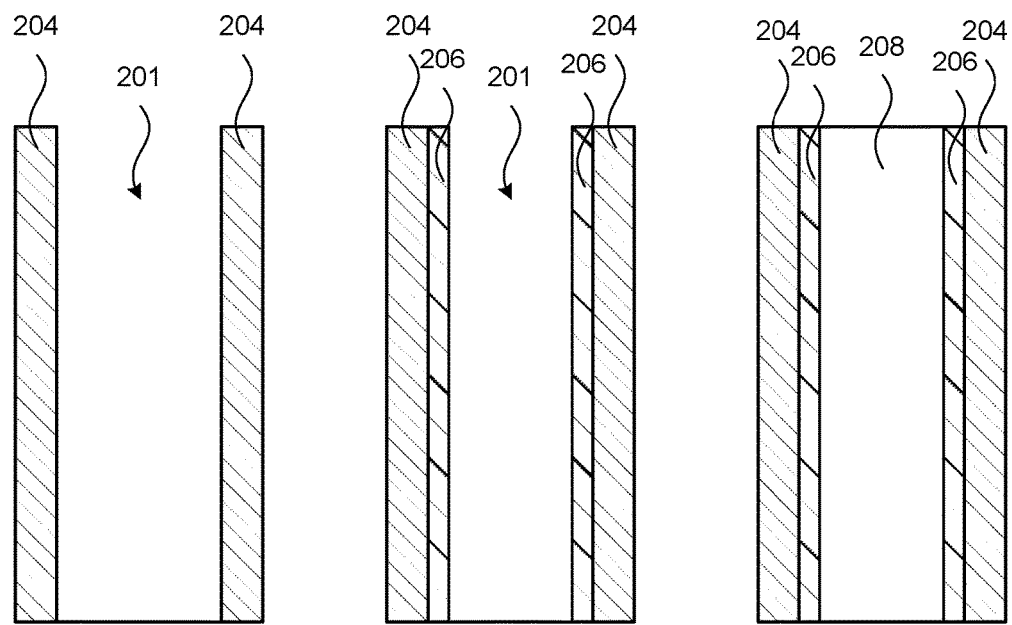
FIGS. 2A-2C schematically shows formation of an exemplary 3D ReRAM element according to an embodiment of the invention.

FIGS. 2A-2C schematically shows formation of an exemplary 3D ReRAM element according to an embodiment of the invention. FIG. 2A shows a pair vertical metal oxide films 204 forming a high aspect ratio recessed feature 201, FIG. 2B shows a pair of vertical conformal TiAlC films 206 formed on the sidewalls of the pair of vertical metal oxide films 204, and FIG. 2C shows an electrode film 208 filling the recessed feature 201 between the pair of vertical conformal TiAlC films 206. FIGS. 2A-2C schematically illustrate the need for good conformality of the TiAlC films 206, where good step coverage and uniform film thickness is required in the high aspect ratio recessed feature 201. Embodiments of the invention utilize thermal ALD of TiAlC films to achieve this requirement. The structure in FIG. 2B or FIG. 2C may be annealed to enhance or initiate the diffusion of oxygen atoms from the metal oxide film 204 into the TiAlC film 106.

In one example, a TiAlC film was deposited by thermal-ALD TiAlC using alternating sequential gaseous exposures of titanium tetrachloride ($TiCl_4$) and trimethylaluminum ($AlMe_3$). Each exposure cycle included sequential exposures of $TiCl_4$, an inert gas purge, $AlMe_3$, and an inert gas purge. The exposure cycles were repeated until the TiAlC film had a desired thickness. In one process example, 130 exposure cycles were performed at a substrate temperature of about 410° C. to deposit a 10 nm thick thermal-ALD TiAlC film. No post-deposition annealing was performed. The thermal-ALD TiAlC film had a resistivity of 1442 μOhm-cm and, as measured by X-ray Photoelectron Spectroscopy (XPS), had a chemical composition of about 34 atomic percent Ti, about 4 atomic percent Al, about 54 atomic percent C, and balance Cl and O impurities. The XPS analysis showed that the TiAlC film was a carbide film with Ti—C and Al—C chemical bonds.

Figure 3:
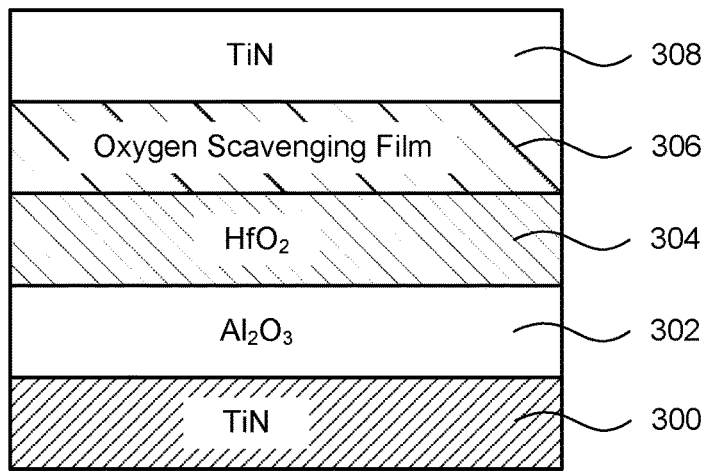
FIG. 3 schematically shows a film structure of a test device used for ReRAM evaluation of a thermal-ALD TiAlC film and other films according to an embodiment of the invention.
Figure 4:
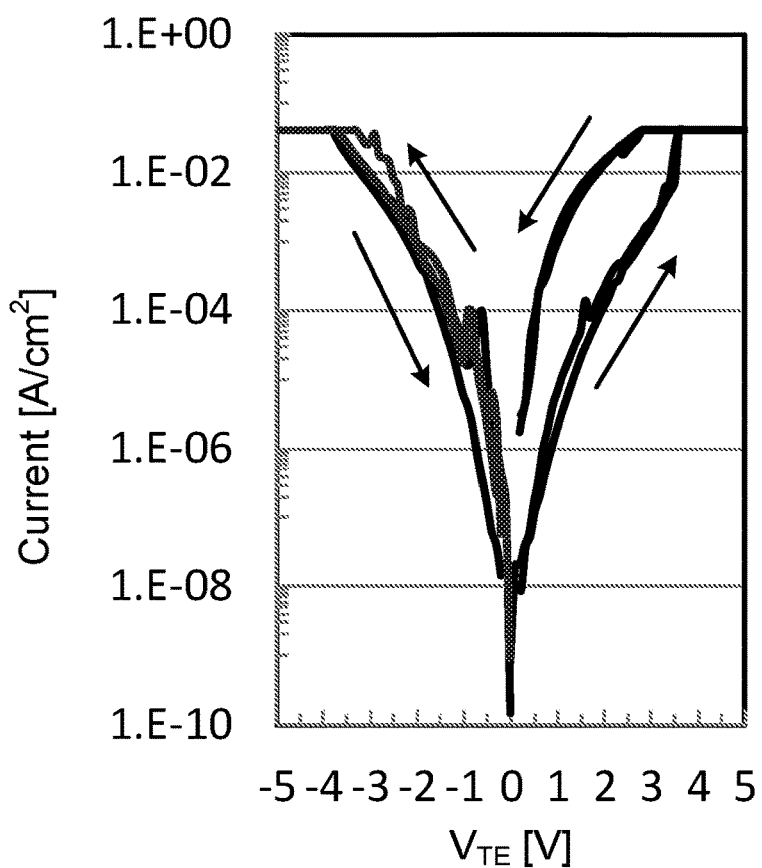
FIG. 4 shows experimental results for ReRAM evaluation of a thermal-ALD TiAlC film.

ReRAM evaluation of a thermal-ALD TiAlC film and other films was performed using a test device schematically shown in FIG. 3. The ReRAM test structure included a TiN first electrode film 300 (BE-TiN), a 2 nm thick $Al_2O_3$ film 302 on the TiN first electrode film 300, a 5 nm thick $HfO_2$ film 304 on the $Al_2O_3$ film 302, an oxygen scavenging film 306 on the $HfO_2$ film 304, and a TiN second electrode film 308 (TE-TiN) on the oxygen scavenging film 306. Different oxygen scavenging films were tested by subjecting the test structure to an electric current sweep and measuring the current switching through the test structure. The test conditions for the ReRAM switching test included a DC current sweep operation that included a current compliance of 4E-2 $A/cm^2$. The different oxygen scavenging films included 1) a thermal-ALD TiAlC film, 2) a plasma-enhanced-ALD TiAlC film, 3) a plasma-enhanced-ALD Ti film, and 4) a thermal-ALD TiN film. The thermal-ALD TiAlC film and the plasma-enhanced-ALD TiAlC film showed successful current switching during more than 50 electric current sweeps, whereas the plasma-enhanced-ALD Ti film did not show successful current switching but instead exhibited large current leaks, and the thermal-ALD TiN film broke down after four current switching cycles. FIG. 4 shows the ReRAM evaluation of the thermal-ALD TiAlC film. The ReRAM switching tests results showed good ReRAM properties for the thermal-ALD TiAlC film and the plasma-enhanced ALD TiAlC film. Further, the testing of the thermal-ALD TiAlC film and the plasma-enhanced-ALD TiAlC film indicated the absence of an initial electroforming step to form a switchable conducting filament for ReRAM.

A plurality of embodiments for ReRAM devices and method of making have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A resistive random access memory, comprising:
   a first electrode film formed on a substrate;
   a metal oxide film with oxygen vacancies formed on the first electrode;
   a conformal TiAlC film, oxidized by diffused oxygen atoms from the metal oxide film, formed on the metal oxide film; and
   a second electrode film formed on the TiAlC film.

2. The resistive random access memory of claim 1, wherein the metal oxide film is selected from the group consisting of $Al_2O_3$, $HfO_2$, $TiO_2$, $ZrO_2$, and a combination thereof.

3. The resistive random access memory of claim 1, wherein the metal oxide film includes a laminate of two or more of $Al_2O_3$, $HfO_2$, $TiO_2$, and $ZrO_2$.

4. The resistive random access memory of claim 1, wherein the conformal TiAlC film is formed by thermal atomic layer deposition (ALD) in the absence of a plasma.

5. The resistive random access memory of claim 4, wherein the conformal TiAlC film is formed by alternating gaseous exposures of a titanium halide and an aluminum alkyl.

6. The resistive random access memory of claim 5, wherein the aluminum alkyl is selected from the group consisting of $Al(Me)_3$, $Al(Et)_3$, $Al(Pr)_3$, and $Al(i-Bu)_3$.

7. The resistive random access memory of claim 5, wherein the titanium halide is selected from the group consisting of $TiF_4$, $TiCl_4$, $TiBr_4$, and $TiI_4$.

8. The resistive random access memory of claim 5, further comprising purging with an inert gas between the alternating gaseous exposures of the titanium halide and the aluminum alkyl.

9. The resistive random access memory of claim 4, wherein the conformal TiAlC film is formed by alternating gaseous exposures of titanium tetrachloride ($TiCl_4$) and trimethylaluminum ($AlMe_3$).

10. The resistive random access memory of claim 1, wherein the conformal TiAlC film is oxidized by diffused oxygen atoms from the metal oxide film during an annealing at a substrate temperature is between about 400° C. and about 600° C.

11. A vertical resistive random access memory, comprising:
a pair of vertical metal oxide films;
a pair of vertical conformal TiAlC films formed on the pair of vertical metal oxide films, the pair of vertical conformal TiAlC films oxidized by diffused oxygen atoms from the pair of vertical metal oxide films; and
an electrode film formed between the pair of vertical conformal TiAlC films.

12. A method of forming a resistive random access memory (ReRAM), the method comprising:
forming a first electrode on a substrate
forming a metal oxide film with oxygen vacancies on the first electrode;
forming a conformal TiAlC film on the metal oxide film, the TiAlC oxidized by diffused oxygen atoms from the metal oxide film; and
forming a second electrode on the TiAlC film.

13. The method of claim 12, wherein the metal oxide film is selected from the group consisting of $Al_2O_3$, $HfO_2$, $TiO_2$, $ZrO_2$, and a combination thereof.

14. The method of claim 12, wherein the metal oxide film includes a laminate of two or more of $Al_2O_3$, $HfO_2$, $TiO_2$, and $ZrO_2$.

15. The method of claim 12, wherein the conformal TiAlC film is formed by thermal atomic layer deposition (ALD) in the absence of a plasma.

16. The method of claim 15, wherein the conformal TiAlC film is formed by alternating gaseous exposures of a titanium halide and an aluminum alkyl.

17. The method of claim 16, wherein the aluminum alkyl is selected from the group consisting of $Al(Me)_3$, $Al(Et)_3$, $Al(Pr)_3$, and $Al(i-Bu)_3$.

18. The method of claim 16, wherein the titanium halide is selected from the group consisting of $TiF_4$, $TiCl_4$, $TiBr_4$, and $TiI_4$.

19. The method of claim 16, further comprising purging with an inert gas between the alternating gaseous exposures of the titanium halide and the aluminum alkyl.

20. The method of claim 15, wherein the conformal TiAlC film is formed by alternating gaseous exposures of titanium tetrachloride ($TiCl_4$) and trimethylaluminum ($AlMe_3$).

* * * * *